United States Patent
Takahashi et al.

(10) Patent No.: US 6,465,330 B1
(45) Date of Patent: Oct. 15, 2002

(54) METHOD FOR GRINDING A WAFER BACK

(75) Inventors: Kazuhiro Takahashi, Kawaguchi (JP); Kazuyoshi Ebe, Saitama (JP); Shinya Takyu, Sugito-machi (JP)

(73) Assignees: Lintec Corporation, Tokyo (JP); Kabushiki Kaisha Toshiba, Kanagawa (JP)

( * ) Notice: Subject to any disclaimer, the term of this patent is extended or adjusted under 35 U.S.C. 154(b) by 0 days.

(21) Appl. No.: 09/387,705

(22) Filed: Aug. 18, 1999

(30) Foreign Application Priority Data

Aug. 18, 1998  (JP) ............................. 10-231602

(51) Int. Cl.$^7$ ............................................. H01L 21/463
(52) U.S. Cl. ...................... 438/464; 428/343; 428/345
(58) Field of Search ........................ 438/464; 428/343, 428/345

(56) References Cited

U.S. PATENT DOCUMENTS

| | | | |
|---|---|---|---|
| 4,756,968 A | 7/1988 | Ebe et al. ................. 428/343 |
| 5,714,029 A | 2/1998 | Uemura et al. .......... 156/275.5 |
| 5,888,883 A | * 3/1999 | Sasaki et al. ............ 438/460 |
| 6,126,772 A | 10/2000 | Yamamoto et al. | |
| 6,312,800 B1 | * 11/2001 | Noguchi et al. .......... 428/354 |

FOREIGN PATENT DOCUMENTS

| | | |
|---|---|---|
| EP | 0 157 508 A | 10/1985 |
| EP | 0622833 | 3/1999 |
| EP | 0 926 732 A | 6/1999 |
| EP | 0 962 509 A | 12/1999 |
| GB | 2 312 429 A | 10/1997 |
| JP | (1980) 55-52235 A | 4/1980 |
| JP | 60196956 | 10/1985 |
| JP | 60223139 | 11/1985 |
| JP | 1-56112 | 11/1989 |
| JP | 5-032946 | 2/1993 |
| JP | (1993) 05-074934 A | 3/1993 |
| JP | 5-335411 | 12/1993 |
| JP | 7-135189 | 5/1995 |
| JP | 8-027239 | 1/1996 |
| WO | WO 97/00534 A | 1/1997 |

* cited by examiner

Primary Examiner—James J. Seidleck
Assistant Examiner—Melanie Bissett
(74) Attorney, Agent, or Firm—Webb Ziesenheim Logsdon Orkin & Hanson, P.C.

(57) ABSTRACT

A surface protective sheet for semiconductor wafer, used in wafer back grinding during a process comprising (1) forming grooves on the surface a of semiconductor wafer furnished with a circuit so that the cutting depth of the grooves are smaller than the thickness of the wafer and (2) grinding the back of the wafer so that the thickness of the wafer is reduced and that the wafer is finally divided into individual chips. The above surface protective sheet is comprised of a substrate and, superimposed thereon, a pressure sensitive adhesive layer having an elastic modulus of at least $1.0 \times 10^5$ Pa at 40° C. This surface protective sheet is applicable to a process which enables producing extremely thin IC chips with high yield.

8 Claims, 3 Drawing Sheets

Tape for mounting

METHOD FOR GRINDING A WAFER BACK

FIELD OF THE INVENTION

The present invention relates to a pressure sensitive adhesive sheet employed for protecting circuit surfaces at the time of wafer back grinding. More particularly, the present invention relates to a pressure sensitive adhesive sheet employed in a wafer working process in which a wafer back is ground to thereby reduce the thickness of the wafer and finally effect the division thereof into individual chips.

BACKGROUND OF THE INVENTION

In recent years, the spread of IC cards has been promoted, and further reduction of the thickness thereof is now demanded. Accordingly, it is required that the thickness of semiconductor chips, which has been about 350 μm, be reduced to 50–100 μm or less.

It is common practice to grind a wafer back after the formation of circuit patterns. When it is intended to grind a wafer to a thickness of, for example, 100 μm or less, the strength of the wafer is decreased with the result that the wafer tends to be broken. In particular, the wafer is brittle, so that, when there is even a slight defect in the wafer, it may occur that cracking is caused by the defect and the crack grows large through the wafer to thereby extremely lower the chip yield.

Japanese Patent Laid-open Publication No. 5(1993)-335411 discloses a process for producing semiconductor chips, in which, for preventing the breakage of wafer attributed to the above growth of cracks, grooves of given death are formed from the wafer surface and thereafter the wafer back is ground.

In this chip producing process, the growth of cracks in the wafer from defects as starting points can be stopped by the grooves.

However, chip breakage has occurred in this method as well. Just before the division of the wafer into individual chips, the chips are in the state of being tied with each other by means of extremely thin bridges. Referring to FIG. 6, the chip brought into contact with a spindle of a back grinder and being currently ground differs from the neighboring chip not brought into contact with the spindle regarding the direction of application of grinding force and the magnitude of applied grinding force. This force difference causes chip dislocation and cracks the above thin bridges to thereby result in chip breakage.

Especially, in the use of conventional widely employed surface protective sheets, the degree of chip dislocation is large and chip breakage is likely to occur because the pressure sensitive adhesive of the surface protective sheets is relatively soft.

The present invention overcomes the problems heretofore encountered in the prior art. The present invention provides surface protective sheet which is applicable to a process enabling production of extremely thin IC chips with a high yield.

SUMMARY OF THE INVENTION

In one aspect of the present invention, a surface protective sheet for semiconductor wafer is provided which is used in wafer back grinding during a process comprising forming grooves on the surface of semiconductor wafer furnished with a circuit so that the cutting depth of the grooves is smaller than the thickness of the wafer, and grinding the back of the wafer so that the thickness of the wafer is reduced and that the wafer is finally divided into individual chips.

This surface protective sheet is comprised of a substrate and, superimposed thereon, a pressure sensitive adhesive layer having an elastic modulus of at least $1.0 \times 10^5$ Pa at 40° C.

It is preferred that the pressure sensitive adhesive layer is composed of an energy radiation curable pressure sensitive adhesive. Further, it is preferred that the pressure sensitive adhesive layer have a shear peel strength of at least 10 kg/cm².

Still further, in the present invention, it is preferred that the surface protective sheet have a compressive strain of 0.1 to 5.0 % at 40 kg/cm².

The use of the surface protective sheet of the present invention enables the production of extremely thin IC chips with high yield.

In another aspect of the present invention, there is provided a method of grinding a wafer back, comprising the steps of:

forming grooves on the surface of semiconductor wafer furnished with a circuit so that the cutting depth of the grooves is smaller than the thickness of the wafer, sticking the above surface protective sheet to the wafer surface furnished with semiconductor circuits, and grinding the back of the wafer so that the thickness of the wafer is reduced and that the wafer is finally divided into individual chips.

DETAILED DESCRIPTION OF THE INVENTION

The present invention will now be described in detail with reference to the appended drawings.

Figure 1:
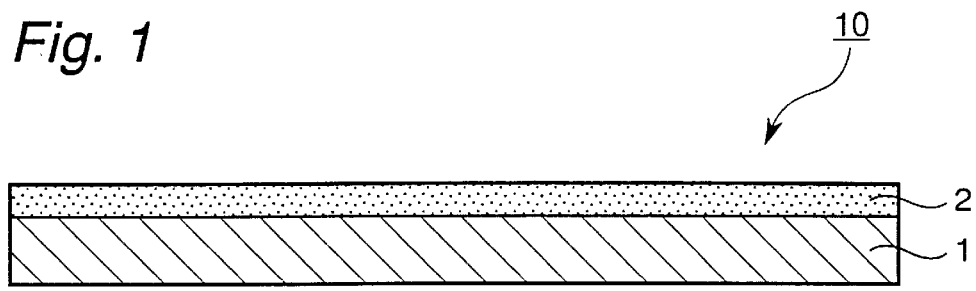
FIG. 1 is a sectional view of the surface protective sheet of the present invention.

Referring to FIG. 1, the surface protective sheet 10 of the present invention comprises substrate 1 and, superimposed thereon, pressure sensitive adhesive layer 2.

The substrate 1 is not particularly limited, and various thin-layer products can be used. For example, paper, metal foils and synthetic resin films can be used as the substrate 1. In particular, in the present invention, the use of synthetic resin films is preferred from the viewpoint of water resistance, heat resistance, etc. Examples of the synthetic resin films include films of polyolefins such as polyethylene, polypropylene, polybutene and polymethylpentene; and films of other polymers such as polyvinyl chloride, polyvinylidene chloride, polyethylene terephthalate, polyethylene naphthalate, polybutylene terephthalate, polybutadiene, polyurethanes, ethylene/vinyl acetate copolymers, ethylene/(meth)acrylic acid copolymers, ethylene/(meth)acrylic ester copolymers, ionomers, polystyrene and polyamides.

Substrates having a thickness and Young's modulus whose product is in the range of 1.0 to 1000 kg/cm, especially 3.0 to 500 kg/cm, are preferably used as the substrate 1.

The thickness of the above substrate 1 is generally in the range of 5 to 300 μm, preferably 10 to 200 μm. The substrate 1 may be composed of either a single layer of any of the above various films or a laminate thereof.

With respect to the film laminate, the films may be either directly laminated onto each other by, for example, dry lamination or laminated through the medium of, for example, an adhesive.

The upper surface, namely the surface of the pressure sensitive adhesive layer 2 furnished side, of the substrate 1 may be treated by corona or may be furnished with another layer such as a primer in order to increase the adherence to the pressure sensitive adhesive.

When the pressure sensitive adhesive layer 2 described below is composed of an energy radiation curable pressure sensitive adhesive, the pressure sensitive adhesive layer 2 may be irradiated with energy radiation. In this case, the film constituting the substrate 1 must be transparent.

In the surface protective sheet 10 of the present invention, pressure sensitive adhesive layer 2 is superimposed on the above substrate 1.

Figure 6:
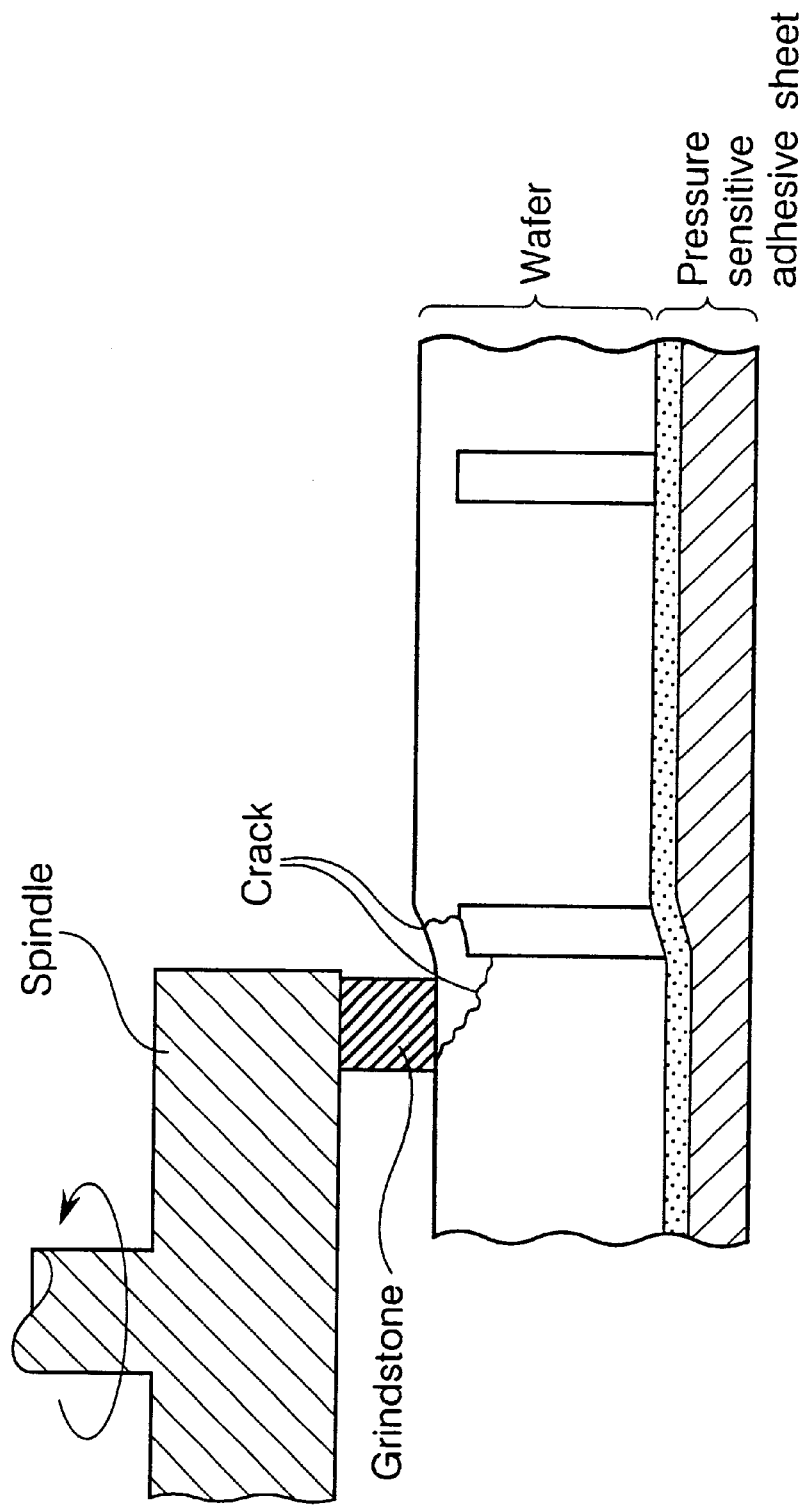
FIG. 6 shows the mechanism of chip breakage occurred in the conventional back grinding method.

The pressure sensitive adhesive layer 2 is composed of a pressure sensitive adhesive having an elastic modulus of at least $1.0 \times 10^5$ Pa, preferably $1.0 \times 10^5$ Pa to $1.0 \times 10^{10}$ Pa, at 40° C. During the grinding of the back of the semiconductor wafer, the surface protective sheet 10 engages in not only surface protection but also wafer fixing. During the back grinding, grinding heat is generated and the heat is conducted to the surface protective sheet 10 with the result that the temperature of the pressure sensitive adhesive layer 2 becomes about 20 to 60° C. Common pressure sensitive adhesives are readily softened by heating, so that their softness is increased in accordance with the advance of the grinding to thereby cause the movement of the wafer (chips). However, in the present invention, use is made of the pressure sensitive adhesive having an elastic modulus of at least $1.0 \times 10^5$ Pa at 40° C., so that the behavior as illustrated in FIG. 6 can be inhibited to thereby enable preventing chip breakage. Pressure sensitive adhesives whose elastic modulus exceeds $1.0 \times 10^{10}$ Pa at 40° C. can also prevent chip breakage. However, the use thereof is liable to make it difficult to maintain other pressure sensitive adhesive performance.

The above elastic modulus means the elastic modulus measured when the back of the wafer is being ground while holding the wafer. For example, when a pressure sensitive adhesive whose elastic modulus is changeable by irradiation with energy radiation, such as an energy radiation curable pressure sensitive adhesive is used, grinding of the wafer back may be performed after sticking the pressure sensitive adhesive layer 2 to the wafer and curing the pressure sensitive adhesive layer 2 by energy radiation irradiation. In this case, the above elastic modulus means the elastic modulus measured when the back of the wafer is being ground while holding the wafer, that is, the elastic modulus of the pressure sensitive adhesive layer having been cured by energy radiation irradiation.

The elastic modulus can be measured by the torsional shear method (elastic modulus G') or the tension and compression method (elastic modulus E'). The elastic modulus of the energy radiation curable pressure sensitive adhesive prior to energy radiation irradiation is measured by the torsional shear method, and that after energy radiation irradiation is measured by the tension and compression method. The elastic modulus G' and the elastic modulus E' in linear regions generally satisfy the relationship E'=3G'. The above elastic modulus defining the present invention means that measured by the tension and compression method. When measurement is made by the torsional shear method, conversion is effected by the use of the formula E'=3G'.

The pressure sensitive adhesive for use in the present invention is not limited as long as the above elastic modulus is exhibited. For example, use can be made of rubber, acrylic, silicone and polyvinyl ether based pressure sensitive adhesives. In the present invention, the use of energy radiation curable pressure sensitive adhesives is preferred. Further, use can be made of energy radiation curable and heat foamable pressure sensitive adhesives.

Although depending on the type of the material thereof, the thickness of the pressure sensitive adhesive layer 2 is generally in the range of about 3 to 100 μm, preferably about 10 to 50 μm.

Various pressure sensitive adhesives can be used as the above pressure sensitive adhesive. In the present invention, the use of energy radiation curable pressure sensitive adhesive is preferred. For example, those listed in Japanese Patent Publication No. 1(1989)-56112 and Japanese Patent Laid-open Publication No. 7(1995)-135189 are preferably used as the energy radiation curable (photocurable, ultraviolet curable or electron beam curable) pressure sensitive adhesive, which in no way limit the scope of energy radiation curable pressure sensitive adhesives useful in the present invention.

For example, low-molecular-weight compounds having in the molecule thereof at least two photopolymerizable carbon to carbon double bonds that can be converted into a three-dimensional network structure by light irradiation as disclosed in Japanese Patent Laid-open Publication Nos. 60(1985)-196,956 and 60(1985)-223,139 are widely used as the energy radiation polymerizable compounds to be incorporated in the energy radiation curable pressure sensitive adhesives. Specific examples thereof include trimethylolpropane triacrylate, pentaerythritol triacrylate, pentaerythritol tetraacrylate, dipentaerythritol monohydroxypentaacrylate, dipentaerythritol hexaacrylate, 1,4-butylene glycol diacrylate, 1,6-hexanediol diacrylate, polyethylene glycol diacrylate and commercially available oligoester acrylate.

Furthermore, besides the above acrylate compounds, urethane acrylate oligomers can be used as the energy radiation polymerizable compounds. Urethane acrylate oligomers can be obtained by reacting an isocyanate-terminated urethane prepolymer which is obtained by reacting a polyol compound such as a polyester or polyether compound with a polyisocyanate compound such as 2,4-tolylene diisocyanate, 2,6-tolylene diisocyanate, 1,3-xylylene diisocyanate, 1,4-xylylene diisocyanate or diphenylmethane-4,4-diisocyanate with a hydroxyl containing acrylate or methacrylate, such as, 2-hydroxyethyl acrylate, 2-hydroxyethyl methacrylate, 2-hydroxypropyl acrylate, 2-hydroxypropyl methacrylate, polyethylene glycol acrylate or polyethylene glycol methacrylate.

With respect to the blending ratio of energy radiation polymerizable compound to acrylic pressure sensitive adhesive in the energy radiation curable pressure sensitive adhesive, it is preferred that 50 to 200 parts by weight, especially 50 to 150 parts by weight, and still especially 70 to 120 parts by weight, of the energy radiation polymerizable compound is used per 100 parts by weight of the acrylic pressure sensitive adhesive. In this instance, the initial adhesive strength of the obtained pressure sensitive adhesive sheet is large, and the adhesive strength is sharply dropped upon irradiation of the pressure sensitive adhesive layer with energy radiation. Accordingly, the peeling at the interface of the chips and the acrylic energy radiation curable pressure sensitive adhesive layer is performed to thereby enable the picking up of the chips.

The acrylic energy radiation curable pressure sensitive adhesive layer may be composed of an energy radiation curable copolymer having an energy radiation polymerizable group as a side chain. This energy radiation curable copolymer simultaneously exhibits satisfactory adherence and energy radiation curability properties. Details of the energy radiation curable copolymer having an energy radiation polymerizable group as a side chain are described in, for example, Japanese Patent Laid-open Publication Nos. 5(1993)-32,946 and 8(1996)-27,239. This pressure sensitive adhesive enables the omission of incorporation of low-molecular-weight substances which lower the elastic modulus to thereby ease the attainment of a high elastic modulus.

The above acrylic energy radiation curable pressure sensitive adhesive possesses satisfactory adhesive strength to adherends before irradiation with energy radiation, and the adhesive strength is extremely decreased upon irradiation with energy radiation. That is, the chips can be held by satisfactory adhesive strength before irradiation with energy radiation, but, after irradiation with energy radiation, the chips can be easily peeled.

The shear peel strength of the above pressure sensitive adhesive layer 2 is preferably at least 10 kg/cm$^2$, still preferably in the range of 10 to 100 kg/cm$^2$, and yet still preferably in the range of 10 to 50 kg/cm$^2$. With respect to the energy radiation curable pressure sensitive adhesive, this shear peel strength also varies depending on whether or not the irradiation with energy radiation has been effected. In the present invention, like the aforementioned elastic modulus, the shear peel strength means that measured when the back of the wafer is being ground while holding the wafer. The adhesive strength of the energy radiation curable pressure sensitive adhesive is extremely decreased upon irradiation with energy radiation, so that peeling is likely to occur during the grinding step. However, if the stress in the direction of shear (shear peel strength) is large, the peeling during the grinding step is inhibited irrespective of the 180° peel strength. Therefore, when the shear peel strength is within the above ranges, the wafer (chips) are firmly held during the back grinding to thereby enable the prevention of chip breakage.

The compressive strain of the surface protective sheet of the present invention is preferably in the range of 0.1 to 5.0%, still preferably 0.5 to 4.5%.

The compressive strain of the sheet is measured under a load of 40 kg/cm$^2$ in accordance with Japanese Industrial Standard (JIS) K 7208.

When the compressive strain of the sheet falls within the above ranges, the height difference between the chip brought into contact with a spindle and being currently ground and the neighboring chip not brought into contact with the spindle becomes relatively small to thereby enable preventing chip breakage (cracking).

The above surface protective sheet 10 of the present invention is used as means for protecting the wafer surface and for temporarily fixing the wafer in a wafer back grinding process wherein a wafer of predetermined thickness having a surface furnished with semiconductor circuits and a back is provided, grooves of a cut depth smaller than the thickness of the wafer are formed from the wafer surfaces, and the back of the wafer is ground so that the thickness of the wafer is reduced and that the wafer is finally divided into individual chips.

More specifically, the surface protective sheet 10 is used in a wafer back grinding process comprising the following steps.

Figure 2:
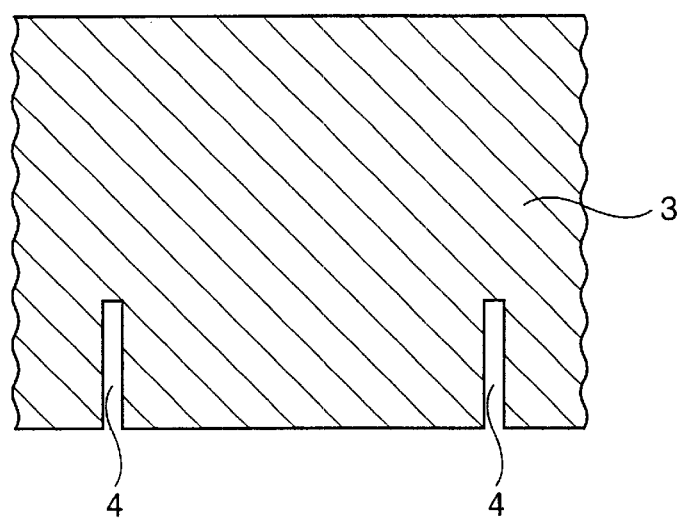
FIGS. 2–5 show process steps for producing thin IC chips with the use of the surface protective sheet (pressure sensitive adhesive sheet) of the present invention.

First step: Grooves 4 of predetermined depth are formed by cutting from the surface of the wafer 3 along streets for partitioning a plurality of circuits (see FIG. 2).

Figure 3:
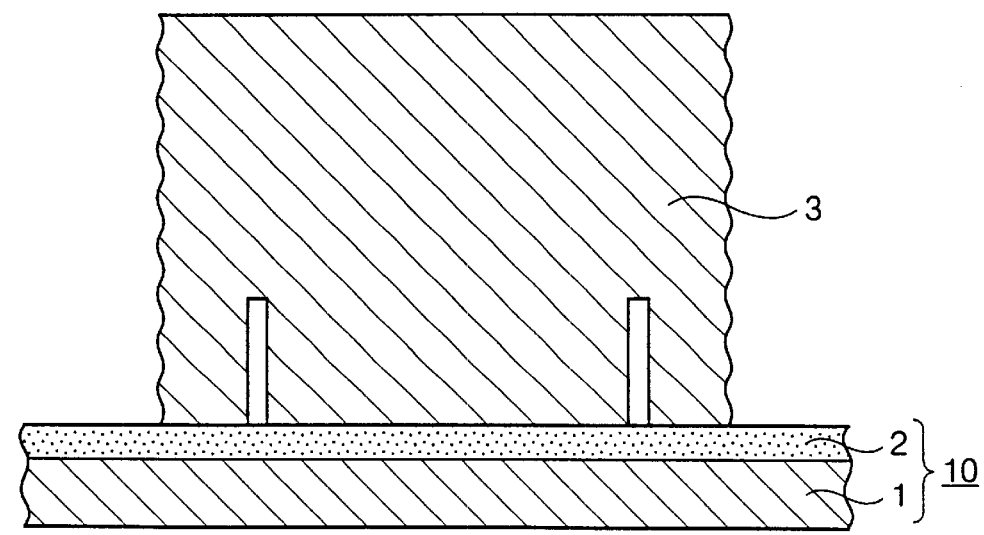

Second step: The surface protective sheet 10 of the present invention is stuck so that all the surface of the wafer 3 is covered thereby (see FIG. 3).

Figure 4:
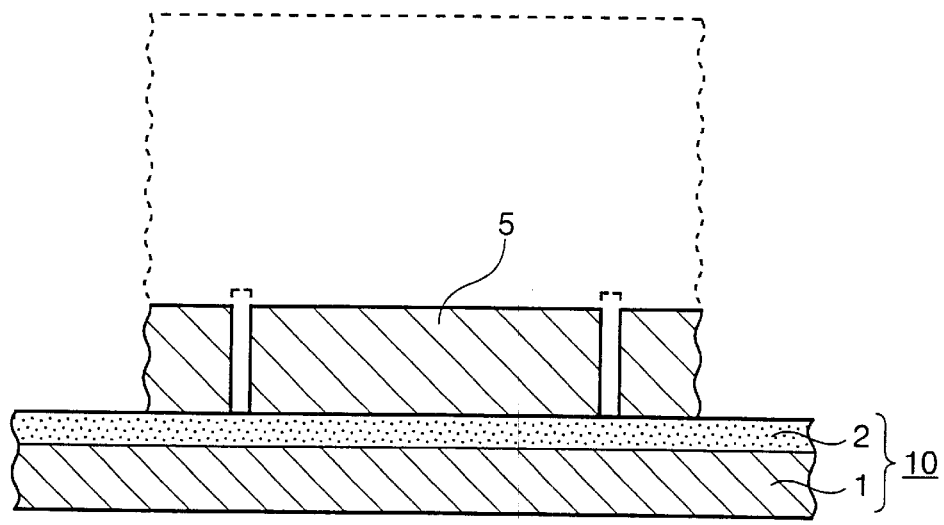

Third step: The back of the wafer is ground so that the bottoms of the above grooves 4 are removed and that a desired thickness is realized to thereby accomplish the division into individual chips 5 (see FIG. 4).

Figure 5:
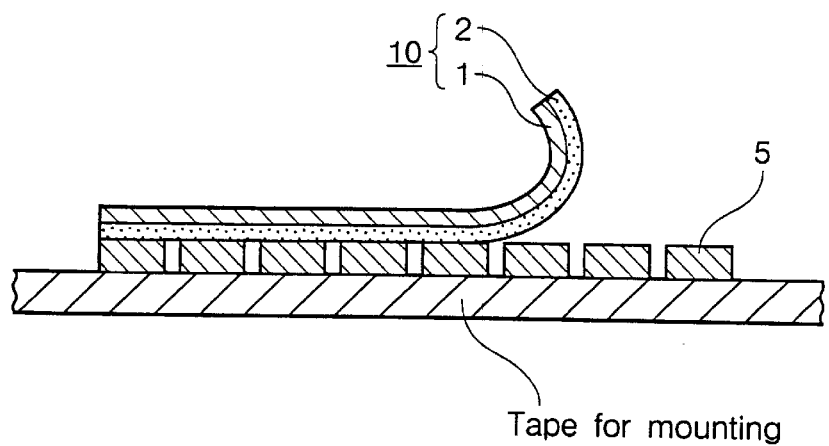

Thereafter, when the pressure sensitive adhesive layer 2 is composed of the energy radiation curable pressure sensitive adhesive, the pressure sensitive adhesive layer 2 is irradiated with energy radiation to thereby reduce the adhesive strength. A pressure sensitive adhesive tape (tape for mounting as described in Japanese Patent Laid-open Publication No. 5(1993)-335411) is stuck to ground surfaces of the chips, and the surface protective sheet 10 is peeled (see FIG. 5). The chips are picked up from the pressure sensitive adhesive tape and mounted on a given base.

When the pressure sensitive adhesive layer 2 is composed of a soft energy radiation curable pressure sensitive adhesive, the pressure sensitive adhesive layer 2 is irradiated with energy radiation from the substrate side in the above second step so that the elastic modulus of the pressure sensitive adhesive layer 2 can be controlled to fall within the above ranges. In this instance, further irradiation with energy radiation is not needed after the division into individual chips 5.

The above process enables the easy production of thin IC chips with high yield.

As apparent from the foregoing, the surface protective sheet of the present invention enables the production of extremely thin IC chips with high yield.

EXAMPLE

The present invention will now be illustrated in greater detail with reference to the following Examples, which in no way limit the scope of the invention.

In the Examples and Comparative Examples, the elastic modulus, shear peel strength, compressive strain of sheet and crack occurrence ratio were measured by the following methods.

Elastic modulus (1) elastic modulus G' (torsional shear method)

test piece: cylinder of 8 mm diameter and 3 mm height, measuring apparatus: DYNAMIC ANALYZER RDA II (manufactured by REOMETRIC SCIENTIFIC F.E. LTD.), and measuring frequency: 1 Hz.

When the elastic modulus was measured by the torsional shear method, the value G' was trebled to thereby convert the same to the value E'.

(2) elastic modulus E' (tension and compression method)

test piece: 50 mm (length)×4 mm (width)×0.5 mm (thickness), measuring apparatus: RHEOVIBRON DDV-II-EA (manufactured by Orientec Corporation), and measuring frequency: 11 Hz.

Shear peel strength test piece: 15 mm (width)×100 mm (length), and measuring apparatus: INSTRON MODEL 4204 (manufactured by Instron corporation).

The above test piece was stuck to a specular wafer by means of a 1 kg roller so that the area at which the test piece and the wafer adhered to each other was 15 mm×15 mm.

The test piece and the wafer were held by respective chucks, and measuring was made by peeling in the vertical direction (shear direction) at a head speed of 50 mm/min.

Compressive strain of sheet

The compressive strain was measured in the following manner according to Japanese Industrial Standard (JIS) K 7208.

A 5 mm thick sample was prepared by piling 10 mm×10 mm sheets one upon another. Load was applied to the sample in the thickness direction at a measuring speed of 5 mm/min by means of INSTRON MODEL 4204 (manufactured by Instron Corporation) to thereby obtain a compressive load/deformation curve. The compressive strain at a compressive load of 40 kg/cm$^2$ was calculated from a curve value.

Crack occurrence ratio

A silicon wafer of 6 inch diameter and 700 μm thickness was stuck to a dicing sheet (Adwill D-628 produced by Lintec Corporation), and grooves were formed by DAD 2H/6T (manufactured by Disco Corporation) using a 35 μm thick blade under conditions such that the cut depth was 400 μm and the chip size was 10 mm sq. Thereafter, the pressure sensitive adhesive sheet produced in each of the Examples and Comparative Examples was stuck to the grooved surface of the wafer. The dicing sheet was stripped off, and grinding was performed by means of DFG 840 (manufactured by Disco Corporation) until the wafer thickness became 80 μm. In Example 4, the pressure sensitive adhesive sheet was irradiated with energy radiation (ultraviolet rays) prior to the grinding step. In Examples 1 to 3 and the Comparative Examples, the pressure sensitive adhesive sheet was irradiated with energy radiation (ultraviolet rays) after the completion of the grinding step. In Example 5, irradiation of the pressure sensitive adhesive sheet with energy radiation (ultraviolet rays) was not performed. The pressure sensitive adhesive sheet was stripped off, and, among the divided chips, the number of cracked chips was counted. The crack occurrence ratio was calculated by the formula:

$$\text{crack occurrence ratio } (\%) = \frac{\text{No. of cracked chips}}{\text{Total no. of chips}} \times 100$$

Example 1

100 parts by weight of a 25% ethyl acetate solution of an acrylic copolymer having a weight average molecular weight of 300,000, prepared from 60 parts by weight of butyl acrylate, 10 parts by weight of methyl methacrylate and 30 parts by weight of 2-hydroxyethyl acrylate, was reacted with 7.0 parts by weight of methacryloyloxyethyl isocyanate to thereby obtain an energy radiation curable copolymer. 0.5 part by weight of polyisocyanate compound (Coronate L produced by Nippon Polyurethane Industry Co., Ltd.) and 1.0 part by weight of photopolymerization initiator (Irgacure 184 produced by Ciba Specialty Chemicals K.K.) were mixed with 100 parts by weight, in terms of solid contents, of the energy radiation curable copolymer, thereby obtaining an energy radiation curable pressure sensitive adhesive.

A 110 μm thick polyethylene film (Young's modulus× thickness=14.3 kg/cm) was coated with the energy radiation curable pressure sensitive adhesive so that the coating thickness after drying was 20 μm. Drying was performed at 100° C. for 1 min, thereby obtaining a pressure sensitive adhesive sheet.

The aforementioned testing was performed using this pressure sensitive adhesive sheet. The results are given in Table 1.

Example 2

The same procedure as in Example 1 was repeated, except that the energy radiation curable copolymer was obtained by reacting 100 parts by weight of a 25% ethyl acetate solution of an acrylic copolymer having a weight average molecular weight of 300,000, prepared from 55 parts by weight of butyl acrylate, 10 parts by weight of methyl methacrylate, 5 parts by weight of methyl acrylate and 30 parts by weight of 2-hydroxyethyl acrylate, with 7.0 parts by weight of methacryloyloxyethyl isocyanate. The results are given in Table 1.

Example 3

The same procedure as in Example 1 was repeated, except that the energy radiation curable copolymer was obtained by reacting 100 parts by weight of a 25% ethyl acetate solution of an acrylic copolymer having a weight average molecular weight of 300,000, prepared from 50 parts by weight of butyl acrylate, 20 parts by weight of methyl methacrylate and 30 parts by weight of 2-hydroxyethyl acrylate, with 7.0 parts by weight of methacryloyloxyethyl isocyanate. The results are given in Table 1.

Example 4

100 parts by weight of an acrylic copolymer having a weight average molecular weight of 300,000, prepared from 90 parts by weight of butyl acrylate and 10 parts by weight of 2-hydroxyethyl acrylate; 120 parts by weight of urethane acrylate oligomer having a weight average molecular weight of 7000 (trade name: SEIKABEAM PU-4, produced by Dainichiseika Color & Chemicals MFG. Co., Ltd.) as a component containing unsaturated groups not reactive with the above acrylic copolymer; 10 parts by weight of polyisocyanate compound (Coronate L produced by Nippon Polyurethane Industry Co., Ltd.); and 4.0 parts by weight of photopolymerization initiator (Irgacure 184 produced by Ciba Specialty Chemicals K.K.) were mixed together, thereby obtaining an energy radiation curable pressure sensitive adhesive. Using this pressure sensitive adhesive, a pressure sensitive adhesive sheet was produced in the same manner as in Example 1, except that the irradiation with energy radiation was performed prior to the grinding step.

The aforementioned testing was performed using this pressure sensitive adhesive sheet. The results are given in Table 1.

Example 5

The same procedure as in Example 1 was repeated, except that an acrylic removable pressure sensitive adhesive obtained by mixing 20 parts by weight of polyisocyanate compound (Coronate L) with 100 parts by weight, in terms of solid contents, of an acrylic copolymer having a weight average molecular weight of 500,000, prepared from 80 parts by weight of isobutyl acrylate, 15 parts by weight of methyl methacrylate and 5 parts by weight of 2-hydroxyethyl acrylate, was used in place of the energy radiation curable pressure sensitive adhesive of Example 1. The results are given in Table 1.

Comparative Example 1

The same procedure as in Example 1 was repeated, except that the energy radiation curable copolymer was obtained by reacting 100 parts by weight of a 25% ethyl acetate solution of an acrylic copolymer having a weight average molecular weight of 300,000, prepared from 80 parts by weight of 2-ethylhexyl acrylate and 20 parts by weight of 2-hydroxyethyl acrylate, with 4.7 parts by weight of methacrylcyloxyethyl isocyanate. The results are given in Table 1.

Comparative Example 2

The same procedure as in Example 1 was repeated, except that the energy radiation curable copolymer was obtained by reacting 100 parts by weight of a 25% ethyl acetate solution of an acrylic copolymer having a weight average molecular weight of 300,000, prepared from 60 parts by weight of butyl acrylate, 10 parts by weight of methyl methacrylate and 30 parts by weight of 2-hydroxyethyl acrylate, with 3.0 parts by weight of methacryloyloxyethyl isocyanate. The results are given in Table 1.

Comparative Example 3

Testing was performed using the pressure sensitive adhesive sheet of Example 4 which was not irradiated with energy radiation. The results are given in Table 1.

TABLE 1

| | Elastic modulus of pressure sensitive adhesive (40° C.) (Pa) | Shear peel strength (kg/cm$^2$) | Compressive strain (%) | Occurrence of crack (%) |
|---|---|---|---|---|
| Example 1 | $1.07 \times 10^5$ | 10.8 | 4.4 | 0 |
| Example 2 | $1.10 \times 10^5$ | 12.8 | 4.1 | 0 |
| Example 3 | $1.48 \times 10^5$ | 13.5 | 3.6 | 0 |
| Example 4 | $4.55 \times 10^8$ | 33.7 | 3.2 | 0 |
| Example 5 | $6.71 \times 10^6$ | 11.5 | 3.5 | 0 |
| Comp. Ex. 1 | $2.00 \times 10^4$ | 7.9 | 6.2 | 7 |
| Comp. Ex. 2 | $8.66 \times 10^4$ | 9.6 | 5.5 | 0.2 |
| Comp. Ex. 3 | $1.78 \times 10^4$ | 6.5 | 7.2 | 9 |

What is claimed is:

1. A method of grinding a wafer back, comprising the steps of:

forming grooves on the surface of a semiconductor wafer furnished with a circuit so that the cutting depth of the grooves is smaller than the thickness of the wafer, sticking to the wafer surface furnished with semiconductor circuits a surface protective sheet comprising a substrate and, superimposed thereon, a pressure sensitive adhesive layer having an elastic modulus of at least $1.0 \times 10^5$ Pa at 40° C., and grinding the back of the wafer so that the thickness of the wafer is reduced and that the wafer is finally divided into individual chips.

2. The method as claimed in claim 1, wherein the pressure sensitive adhesive layer is composed of an energy radiation curable pressure sensitive adhesive, and, after the sticking of the surface protective sheet to the wafer surface furnished with semiconductor circuits, the pressure sensitive adhesive layer is irradiated with energy radiation so that the pressure sensitive adhesive layer has an elastic modulus of at least $1.0 \times 10^5$ Pa at 40° C.

3. The method as claimed in claim 2, wherein the pressure sensitive adhesive layer having been irradiated with energy radiation has a shear peel strength of at least 10 kg/cm$^2$.

4. The method as claimed in claim 2, wherein, after the irradiation with energy radiation, the surface protective sheet has a compressive strain of 0.1 to 5.0% at 40 kg/cm$^2$.

5. The method as claimed in claim 3, wherein, after the irradiation with energy radiation, the surface protective sheet has a compressive strain of 0.1 to 5.0% at 40 kg/cm$^2$.

6. The method as claimed in claim 1, wherein the pressure sensitive adhesive layer is composed of an energy radiation curable pressure sensitive adhesive comprising an energy radiation curable copolymer having an energy radiation polymerizable group as a side chain.

7. The method as claimed in claim 6, wherein the pressure sensitive adhesive layer having been irradiated with energy radiation has a shear peel strength of at least 10 kg/cm$^2$.

8. The method as claimed in claim 6, wherein the surface protective sheet, at the grinding step, has a compressive strain of 0.1 to 5.0% at 40 kg/cm$^2$.

* * * * *

UNITED STATES PATENT AND TRADEMARK OFFICE
CERTIFICATE OF CORRECTION

PATENT NO. : 6,465,330 B1
DATED : October 15, 2002
INVENTOR(S) : Kazuhiro Takahashi et al.

It is certified that error appears in the above-identified patent and that said Letters Patent is hereby corrected as shown below:

Column 1,
Line 31, "death are" should read -- depth are --.
Lines 53-54, "provides surface" should read -- provides a surface --.

Column 9,
Lines 5-6, "methacrylcyloxyethyl" should read -- methacryloyloxyethyl --.

Signed and Sealed this

Fourth Day of March, 2003

JAMES E. ROGAN
*Director of the United States Patent and Trademark Office*